United States Patent [19]

Nagaishi et al.

[11] Patent Number: 5,330,968
[45] Date of Patent: Jul. 19, 1994

[54] LASER ABLATION PROCESS FOR PREPARING OXIDE SUPERCONDUCTING THIN FILMS

[75] Inventors: Tatsuoki Nagaishi; Nobuhiro Ota; Naoji Fujimori, all of Hyogo, Japan

[73] Assignee: Sumitomo Electric Industries, Ltd., Osaka, Japan

[21] Appl. No.: 897,668

[22] Filed: Jun. 12, 1992

[30] Foreign Application Priority Data

Jun. 12, 1991 [JP] Japan .................................. 3-167804

[51] Int. Cl.$^5$ .................... B05D 3/06; H01L 39/24
[52] U.S. Cl. ........................ 505/474; 505/730; 505/732; 427/596; 427/62; 427/126.3; 427/314
[58] Field of Search .................. 505/1, 730, 732; 427/62, 63, 596, 126.3, 314

[56] References Cited

FOREIGN PATENT DOCUMENTS 518772 12/1992 European Pat. Off. .

OTHER PUBLICATIONS

Singh et al., "Effect of processing geometry in oxygen incorporation and in situ formation of YBa$_2$Cu$_3$O$_7$ superconducting thin films by pulsed laser evaporation technique", Appl. Phys. Lett. 55(22) Nov. 1989, pp. 2351–2353.

*Journal of Applied Physics*, vol. 68, No. 3, Aug. 1, 1990, New York pp. 1403–1406, D. S. Misra et al., "Growth of as-deposited superconducting thin films of Y$_1$Ba$_2$Cu$_3$O$_{7-d}$ using Nd:YAG laser".

Applied Physics Letters, vol. 59, No. 27, dated Dec. 20, 1991, New York pp. 3643–3645, H. S. Kowk et al., "Plasma-assisted laser deposition of YBa$_2$Cu$_3$O$_{7-d}$".

Patent Abstracts of Japan, vol. 15, No. 324 (C-859) Aug. 19, 1991 and JP-A-31 22 272.

Patent Abstract of Japan, vol. 15, No. 445 (C-884) Nov. 12, 1991 and JP-A-31 91 054 (Sanyo Electric Co. Ltd.).

*Primary Examiner*—Roy V King
*Attorney, Agent, or Firm*—Kerkam, Stowell, Kondracki & Clarke

[57] ABSTRACT

A laser ablation process for preparing an oxide superconducting thin film characterized in that an electrode is arranged between a substrate and a target. While the film is formed by laser ablation, a bias voltage of 75–100 V is applied between the electrode and the target.

10 Claims, 4 Drawing Sheets

LASER ABLATION PROCESS FOR PREPARING OXIDE SUPERCONDUCTING THIN FILMS

BACKGROUND OF THE INVENTION

1. Field of the Invention

The present invention relates to a laser ablation process for preparing a superconducting thin film and an apparatus for executing such a process, and more specifically to a laser ablation process for preparing a superconducting thin film formed of a compound oxide superconductor material, and an apparatus for executing the process.

2. Description of Related Art

A superconducting phenomenon is used to be though as a phenomenon which occurs at extremely low temperature which is realized by liquid helium cooling. However, Bednorz and Müller et al discovered [La,-Ba]$_2$CuO$_4$ compound oxide superconductor which is superconducting at a temperature of 30K in 1986, Chu et al discovered Y$_1$Ba$_2$Cu$_3$O$_{7-\delta}$ compound oxide superconductor of which the critical temperature T$_c$ is in the range of 90K in 1987, Maeda et al discovered compound oxide superconductors of so called Bi family of which the critical temperature T$_c$ is higher than 100K in 1988. Since these high-T$_c$ copper-oxide type compound oxide superconductors are superconducting by cheep liquid nitrogen cooling, practical applications of superconducting phenomena have been studied by many researchers.

At the beginning, these compound oxide superconductors were prepared as sintered material which were synthesized by solid phase reactions. In these days, the studies have progressed so that extremely high quality compound oxide superconductor thin films have been prepared.

In the prior art, a compound oxide superconductor thin film is deposited on a substrate at substrate temperatures over 700° C. by a laser ablation process which is one of the most suitable process for preparing a compound oxide superconductor thin film. This high substrate temperature causes diffusion of constituent atoms into the depositing compound oxide superconductor thin film. The diffusion of the constituent atoms of the substrate may deteriorate properties of a compound oxide superconductor thin film considerably.

SUMMARY OF THE INVENTION

Accordingly, it is an object of the present invention to provide a laser ablation process for preparing a superconducting thin film formed of a compound oxide superconductor material, which has overcome the above mentioned defects of the conventional ones.

Another object of the present invention is to provide an apparatus for executing such a process.

The above and other objects of the present invention are achieved in accordance with the present invention by a laser ablation process for preparing a compound oxide thin film characterized in that an electrode is arranged between a substrate and a target, and a bias voltage is applied between the electrode and the target while the film is formed by laser ablation.

According to another aspect of the present invention, there is provided an apparatus for a laser ablation process for preparing a compound oxide thin film comprising a vacuum chamber which has a gas inlet, a gas outlet and a window which is transparent for laser-beam which is oscillated by a laser light source, a substrate holder on which a substrate is secured and a target holder on which a target is secured in parallel with the substrate in the vacuum chamber characterized in that the apparatus further includes an electrode between the substrate and the target and a bias source which is connected to the electrode and the target so that a bias voltage can be applied between the electrode and the target.

In a preferred embodiment, the bias voltage is applied so that the electrode has a positive potential and the bias voltage is selected in a range of 75 to 100 volts. The electrode is preferably arranged closer to the substrate than to the target. The distance from the substrate to the electrode is preferably selected in a range of 1 to 20 mm from the substrate.

It is preferable that the electrode is formed of a metal net, particularly, formed of a Pt, Au or an alloy net, which includes Pt or Au. Additionally, the electrode net is preferably shaped cylindrical or plane.

In accordance with the present invention, the substrate temperature can be lowered so as to prevent diffusion of constituent atoms into the depositing compound oxide superconductor thin film. The substrate temperature is preferably selected in a range of 400° to 650° C.

In a preferred embodiment, the compound oxide superconductor thin film is formed of a high-T$_c$ (high critical temperature) oxide superconductor, particularly, formed of a high-T$_c$ copper-oxide type compound oxide superconductor for example a Y-Ba-Cu-O type compound oxide superconductor material, a Bi-Sr-Ca-Cu-O type compound oxide superconductor material, and a Tl-Ba-Ca-Cu-O type compound oxide superconductor material.

In addition, the substrate can be formed of a single crystal oxide substrate such as a MgO (100) substrate, a SrTiO$_3$ (100) substrate, an yttrium stabilized zirconia (YSZ) substrate, etc.

In a preferred embodiment, the laser ablation process is carried out under a condition of which gas pressure is selected in a range of 100 to 800 mTorr, laser power density of the laser-beam is selected in a range of 0.5 to 5.0 Joule/cm$^2$ and a distance between the substrate and the target is selected in a range of 30 to 100 mm.

The above and other objects, features and advantages of the present invention will be apparent from the following description of preferred embodiments of the invention with reference to the accompanying drawings.

DESCRIPTION OF THE PREFERRED EMBODIMENTS

Figure 1:
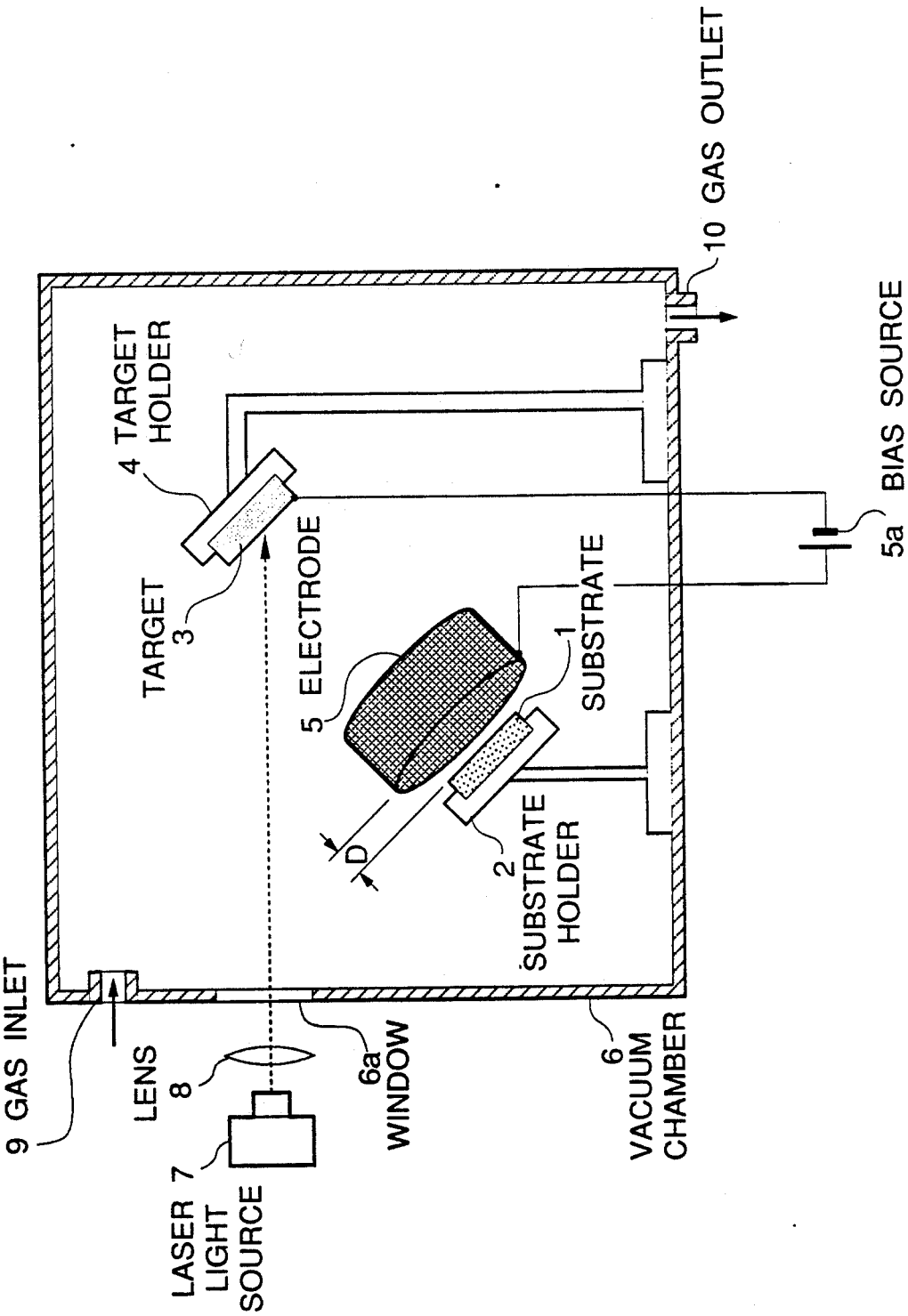
FIG. 1 is a diagrammatic view of a preferred embodiment of the apparatus in accordance with the present invention.

FIG. 1 shows a diagrammatic view of one preferred embodiment of the apparatus in accordance with the present invention. In FIG. 1, the apparatus includes a chamber 6 in which a substrate holder 2 on which a substrate 1 is secured, a target holder 4 on which a target 3 is secured in parallel with the substrate 1, and a electrode 5 arranged between the substrate 1 and the target 3 at a distance D from the substrate 1 are equipped. The chamber 6 includes a window 6a, an inlet 9 and an outlet 10. The window 6a is transparent for laser-beam which is oscillated by a laser light source 7. The laser-beam is focused on the target 3 by a lens 8. Arbitrary gases are supplied to the chamber 6 through the inlet 9, and the chamber 6 is evacuated through the outlet 10. Therefore, an atmosphere and a gas pressure of the chamber 6 can be controlled at will.

The electrode 5 is formed of a cylindrical metal net which is arranged so as to surround a plume which is generated on the target 3 towards the substrate 1 by the laser-beam. The electrode 5 is connected to the anode of a bias source 5a of which cathode is connected to the target 3.

Figure 2:
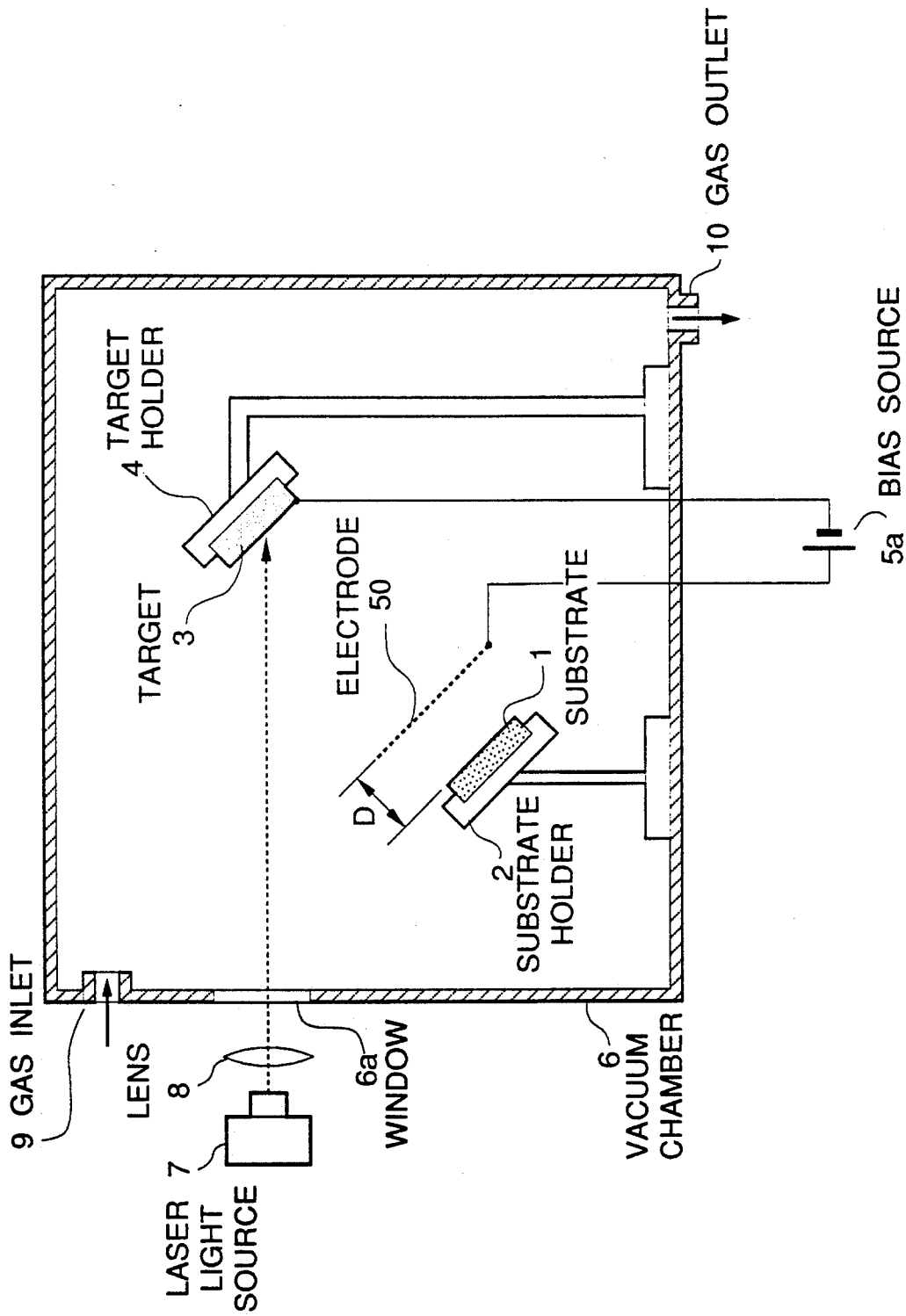
FIG. 2 is a diagrammatic view of another preferred embodiment of the apparatus in accordance with the present invention.

FIG. 2 shows another preferred embodiment of the apparatus in accordance with the present invention, which includes a electrode 50 which has different shape from that of the electrode 5 shown in FIG. 1. Other components of the apparatus are substantially same as those of the apparatus shown in FIG. 1, which are indicated by same reference numbers. Therefore, the following descriptions of the apparatus explain about electrode 50 mainly.

The electrode 50 is formed of a plane metal net which is arranged between the substrate 1 and the target 3 at a distance D from the substrate 1 in parallel with the substrate 1 and the target 3.

EMBODIMENT 1

Y-Ba-Cu-O compound oxide superconductor thin films were prepared by laser ablation process in accordance with the present invention by using the apparatus shown in FIG. 1. Different bias voltages ranging 0 to 150 volts were applied to the electrode 5 so that the electrode had a positive potential while each Y-Ba-Cu-O compound oxide superconductor thin film was formed by laser ablation.

The electrode 5 was composed of a cylindrical Pt net which had a length of 10 mm and a diameter 20 mm, and was arranged at the distance of 3 mm from the substrate 1. An MgO(100) substrate was used for the substrate 1 and a $Y_1Ba_2Cu_{3.0}O_y$ compound oxide sinter was used for the target 3. The other conditions of the laser ablation process were as follows;

| | |
|---|---|
| Laser wave length | 193 nanometers |
| Repetition rate | 1 Hz |
| Temperature of substrate | 600° C. |
| Pressure | 400 mTorr |
| Distance from the substrate to the target | 40 mm |
| Density of the Laser Power | 0.7 Joule/cm$^2$ |
| Thickness of the thin film | 200–300 nanometers |

Figure 3:
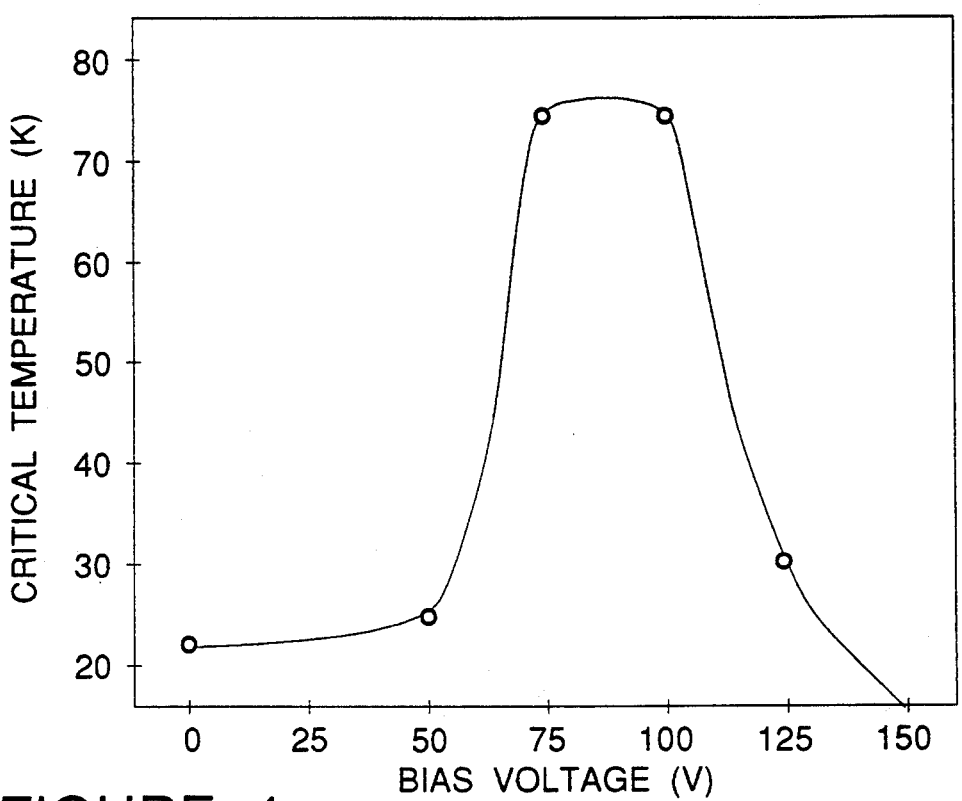
FIG. 3 is a graph of the critical temperatures of compound oxide thin films against the bias voltages for a first embodiment of the process in accordance with the present invention.

A graph of the critical temperatures of the Y-Ba-Cu-O compound oxide superconductor thin films against the bias voltages which were applied to the electrode 5 during the laser ablation process is shown in FIG. 3. The graph shows that the critical temperatures of the Y-Ba-Cu-O compound oxide superconductor thin films which were prepared by the laser ablation process with applying a bias voltage ranging 75 to 100 volts are 50K higher than that of the Y-Ba-Cu-O compound oxide superconductor thin films which were prepared without bias voltage.

Data of X-rays diffraction meter showed that the Y-Ba-Cu-O compound oxide superconductor thin film changed from a mixture of a-axis oriented thin film and (110) oriented thin film to c-axis orientated thin film, as the bias voltage increased.

It was proved that the surfaces of the Y-Ba-Cu-O compound oxide superconductor thin films which were prepared by the laser ablation process with applying a bias voltage ranging 75 to 100 volts were extremely smooth by the observations of a scanning electron microscope.

EMBODIMENT 2

Y-Ba-Cu-O compound oxide superconductor thin films were prepared by the laser ablation process in accordance with the present invention. The apparatus which was used for the process was same as the apparatus used in Embodiment 1 except that the electrode 5 was arranged at the distance of 20 mm from the substrate 1. Different bias voltages ranging 0 to 150 volts were applied to the electrode 5 so that the electrode had a positive potential while each Y-Ba-Cu-O compound oxide superconductor thin film was formed by laser ablation. Other conditions of the process were same as that of the process in Embodiment 1.

Figure 4:
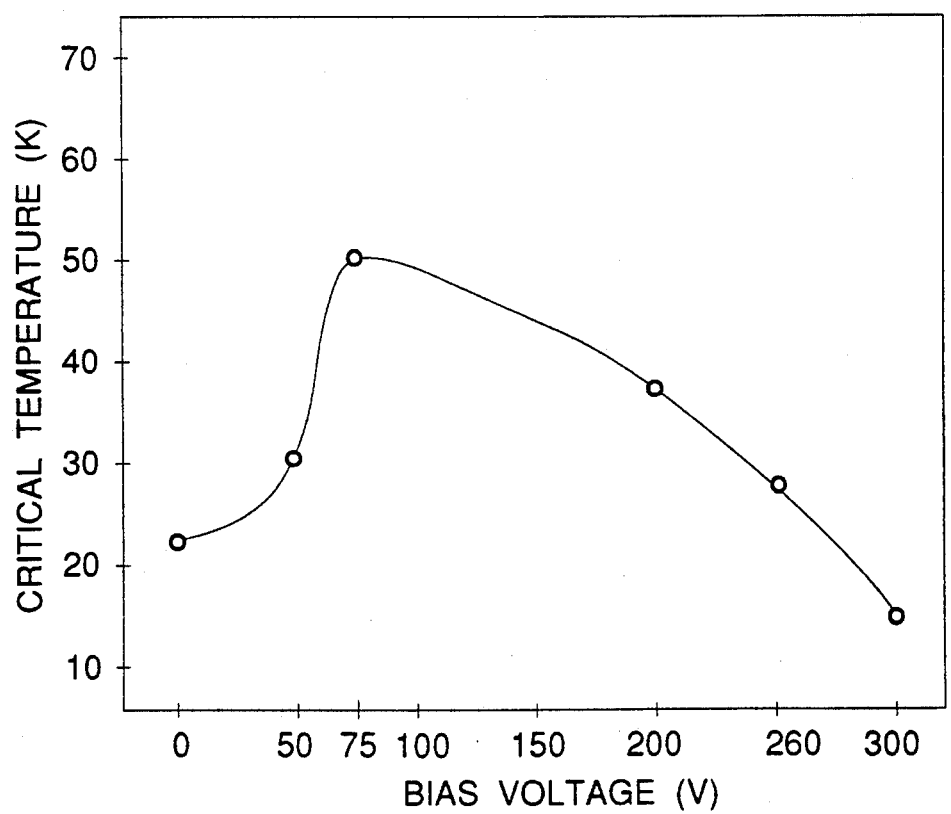
FIG. 4 is a graph of the critical temperatures of compound oxide thin films against the bias voltages for a second embodiment of the process in accordance with the present invention.

A graph of the critical temperatures of the Y-Ba-Cu-O compound oxide superconductor thin films against the bias voltages which were applied to the electrode 5 during the laser ablation process is shown in FIG. 4. The graph shows that the critical temperatures of the Y-Ba-Cu-O compound oxide superconductor thin films which were prepared by the laser ablation process with applying a bias voltage of about 75 volts are extremely higher than that of the Y-Ba-Cu-O compound oxide superconductor thin films which were prepared without bias voltage.

Data of X-rays diffraction meter showed that the Y-Ba-Cu-O compound oxide superconductor thin film changed from a mixture of a-axis oriented thin film and (110) oriented thin film to c-axis orientated thin film, as the bias voltage increased.

It was proved that the surfaces of the Y-Ba-Cu-O compound oxide superconductor thin films which were prepared by the laser ablation process with applying a bias voltage ranging 75 to 100 volts were extremely smooth by the observations of a scanning electron microscope.

Additionally, from the results of Embodiment 1 and 2, it was clear that the electrode 5 had to be arranged near the substrate 1 in order to prepare a compound oxide superconductor thin film of favorable properties.

On the other hand, Y-Ba-Cu-O compound oxide superconductor thin films which were prepared with applying a reverse bias voltage had semiconductor properties and were not superconducting at all.

EMBODIMENT 3

Y-Ba-Cu-O compound oxide superconductor thin films were prepared by laser ablation process in accordance with the present invention by using the apparatus shown in FIG. 2. Different bias voltages ranging 0 to 150 volts were applied to the electrode 50 so that the electrode had a positive potential while each Y-Ba-Cu-O compound oxide superconductor thin film was formed by laser ablation.

The electrode 50 was composed of a square Pt net of which a side was 20 mm, and was arranged at the distance of 5 mm from the substrate 1. An MgO(100) substrate was used for the substrate 1 and a $Y_1Ba_2Cu_{3.8}O_y$ compound oxide sinter was used for the target 3. The other conditions of the laser ablation process were as follows;

| | |
|---|---|
| Laser wave length | 193 nanometers |
| Repetition rate | 1 Hz |
| Temperature of substrate | 600° C. |
| Pressure | 400 mTorr |
| Distance from the substrate to the target | 40 mm |
| Density of the Laser Power | 0.7 Joule/cm² |
| Thickness of the thin film | 200–300 nanometers |

Figure 5:
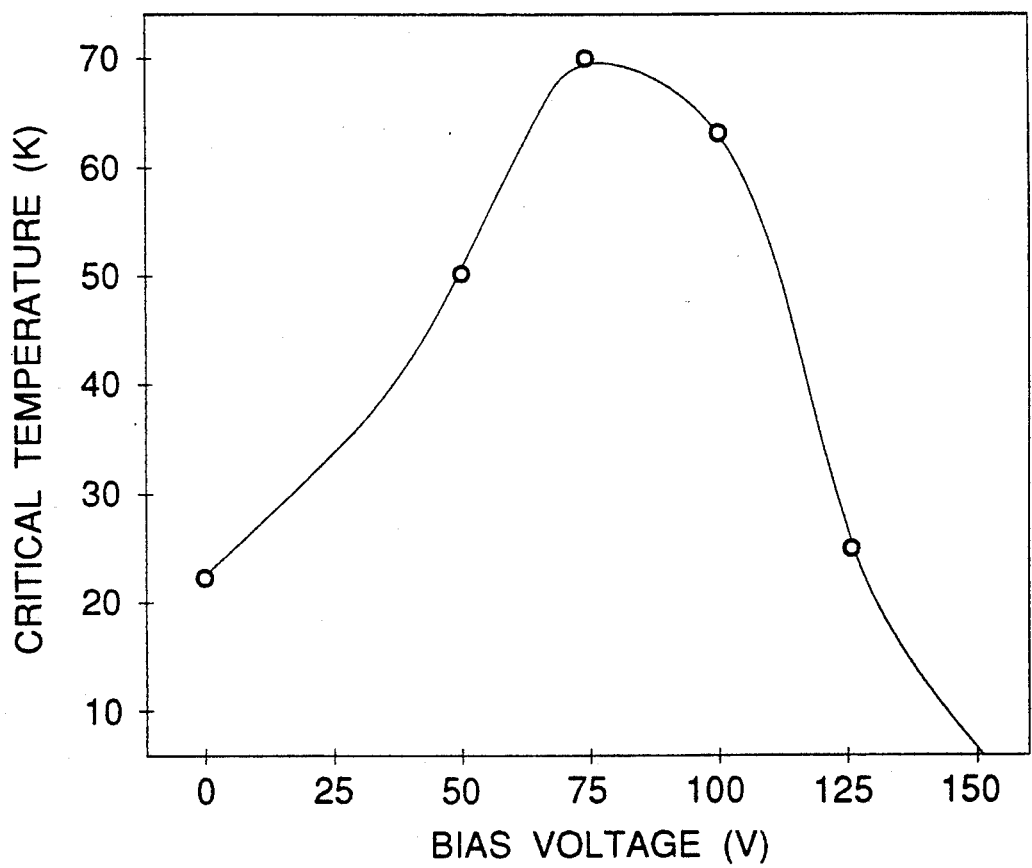
FIG. 5 is a graph of the critical temperatures of compound oxide thin films against the bias voltages for a third embodiment of the process in accordance with the present invention.

A graph of the critical temperatures of the Y-Ba-Cu-O compound oxide superconductor thin films against the bias voltages which were applied during the laser ablation process is shown in FIG. 5. The graph shows that the critical temperatures of the Y-Ba-Cu-O compound oxide superconductor thin films which were prepared by the laser ablation process with applying a bias voltage about 75 volts are extremely higher than that of the Y-Ba-Cu-O compound oxide superconductor thin films which were prepared without bias voltage.

Data of X-rays diffraction meter showed that the Y-Ba-Cu-O compound oxide superconductor thin film changed from a mixture of α-axis oriented thin film and (110) oriented thin film to c-axis orientated thin film, as the bias voltage increased.

It was proved that the surfaces of the Y-Ba-Cu-O compound oxide superconductor thin films which were prepared by the laser ablation process with applying a bias voltage ranging 75 to 100 volts were extremely smooth by the observations of a scanning electron microscope.

As explained above, if the superconducting thin film is prepared in accordance with the process of the present invention, the temperature of substrate can be lowered during the laser ablation process. Therefore, it is easy to prepare the superconducting thin film with good repeatability, and the prepared superconducting thin film has a good film condition and a high performance.

The invention has thus been shown and described with reference to the specific embodiments. However, it should be noted that the present invention is in no way limited to the details of the illustrated structures but conversions and modifications may be made within the scope of the appended claims.

We claim:

1. In a laser ablation process for preparing a compound copper-oxide superconductor film on a substrate, the improvement comprising arranging an electrode between a substrate and a target, wherein said electrode is of a shape selected from the group consisting of: a planar shape which extends across an area between the substrate and the target and a cylindrical shape; and
   applying a bias voltage having a potential which is 75 to 100 volts higher than a potential of said target between the electrode and the target while the film is formed by the laser ablation.

2. A laser ablation process claimed in claim 1 wherein the electrode is arranged at a distance selected in a range of 1 to 20 mm from the substrate.

3. A laser ablation process claimed in claim 1 wherein the electrode is a metal net.

4. A laser ablation process claimed in claim 3 wherein the metal is Pt, Au or an alloy which contains either Pt or Au.

5. A laser ablation process claimed in claim 1 wherein substrate temperature is selected in a range of 400° to 650° C.

6. A laser ablation process claimed in claim 1 wherein the compound copper-oxide superconductor is selected from the group consisting of a Y-Ba-Cu-O compound oxide superconductor material, a Bi-Sr-Ca-Cu-O compound oxide superconductor material, and a Tl-Ba-Ca-Cu-O compound oxide superconductor material.

7. A laser ablation process claimed in claim 1 wherein the substrate is a material selected from the group consisting of a MgO (100) substrate, a $SrTiO_3$ (100) substrate and an yttrium stabilized zirconia (YSZ) substrate.

8. A laser ablation process claimed in claim 1 wherein gas pressure during laser ablation is selected in a range of 100 to 800 mTorr.

9. A laser ablation process claimed in claim 1 wherein laser power density of a laser-beam which is directed to the target is selected in a range of 0.5 to 5.0 Joule/cm².

10. A laser ablation process claimed in claim 1 wherein a distance between the substrate and the target is selected in a range of 30 to 100 mm.

* * * * *

UNITED STATES PATENT AND TRADEMARK OFFICE
CERTIFICATE OF CORRECTION

PATENT NO. : 5,330,968
DATED : July 19, 1994
INVENTOR(S) : NAGAISHI et al

It is certified that error appears in the above-indentified patent and that said Letters Patent is hereby corrected as shown below:

Col. 6, line 33 (Claim 6, line 2) "superconductor is" shoul be --superconductor film is--.

Col. 6, line 39 (Claim 7, line 2) "is a material selected" should be --is selected--.

Signed and Sealed this

Fourth Day of April, 1995

Attest:

BRUCE LEHMAN

*Attesting Officer*            *Commissioner of Patents and Trademarks*